United States Patent
Tsujikawa et al.

(10) Patent No.: US 6,816,231 B2
(45) Date of Patent: Nov. 9, 2004

(54) METHOD AND APPARATUS FOR EXPOSURE

(75) Inventors: Susumu Tsujikawa, Urayasu (JP); Yukio Taniguchi, Yokohama (JP); Hirotaka Yamaguchi, Kawasaki (JP); Masakiyo Matsumura, Kamakura (JP)

(73) Assignees: Kabushiki Kaisha Ekisho Sentan, Yokohama (JP); Fijutsu Kaihatsu Center, Kanagawa-Ken (JP)

( * ) Notice: Subject to any disclaimer, the term of this patent is extended or adjusted under 35 U.S.C. 154(b) by 0 days.

(21) Appl. No.: 10/458,387

(22) Filed: Jun. 9, 2003

(65) Prior Publication Data

US 2003/0231290 A1 Dec. 18, 2003

(30) Foreign Application Priority Data

Jun. 18, 2002 (JP) .................................... 2002-177098

(51) Int. Cl.[7] .................. G03B 27/42; G03B 27/32; G03B 27/52; G03B 27/70
(52) U.S. Cl. .................. 355/53; 77/55; 77/57
(58) Field of Search .................. 355/53, 55, 43, 355/51, 50, 57, 72, 75, 77, 67; 430/22, 396; 356/399, 400, 401; 359/615; 250/548, 491.1, 492.1

Primary Examiner—Peter B. Kim
(74) Attorney, Agent, or Firm—Graybeal Jackson Haley LLP (57) ABSTRACT

Disclosed is an exposure method and apparatus (aligner) for exposure wherein there is reduced a physical load put on a driving mechanism which moves a supporting device for supporting a mask and an exposure object which has a photosensitive material, and the structure of the driving mechanism is simplified. The method comprises an incidence step of letting at least a part of light from a light source for exposure be incident on a mask supported by a supporting device; an imaging step of letting transmission light from the mask be incident on a photosensitive material supported by the supporting device from a direction which is different from a direction of light incident on the mask, thereby causing the transmission light to form an image on the photosensitive material; a rotation step of rotating the supporting device such that a position of irradiation to the mask caused by light from the light source changes along a circumferential direction of the supporting device; and an irradiation position changing step of changing the position of irradiation of light to the mask as well as a position of irradiation of light to the photosensitive material along a direction which is different from the circumferential direction of the supporting device in a rotating plane of the supporting device while the supporting device is being rotated.

20 Claims, 8 Drawing Sheets

FIG. 8

METHOD AND APPARATUS FOR EXPOSURE

BACKGROUND OF THE INVENTION

1. Field of the Invention

The present invention relates to an exposure method of exposing a pattern which is shaped on a photomask or reticle (referred to as "mask" hereinafter) to the light, thereby imaging the mask pattern on a photosensitive material, and also relates to an exposure apparatus (referred to as "aligner" hereinafter) for executing the method. Especially, the invention relates to a preferable exposure method and aligner as an exposure technique applicable, for example, to the photolithographic process in the manufacture of a semiconductor integrated circuit (SIC), a liquid crystal display (LCD), a flexible printed circuit board, and so forth; and also used as a preferable exposure technique applicable, for example, to a scanner for use in a printing plate maker, an electronic copy machine, and so forth.

2. Prior Art

Among various kinds of aligners as used in the photolithographic process, one of the processes of manufacturing a semiconductor integrated circuit, a liquid crystal display, and so forth, there is an aligner called a projection aligner which exposes the exposure mask pattern on the photosensitive material with the help of an imaging optical system.

As one of aligners like the above, there is disclosed a projection aligner of the type wherein, for example, a mask and an object to be exposed (referred to as "exposure object" hereinafter) which has a photosensitive material are supported by an identical stage such that their respective surfaces on which light is incident are approximately in an identical plane, and the light from a light source is first incident on the mask, and then, the light passing through the mask forms an image on the photosensitive material by using the imaging optical system (refer to the specification of U.S. Pat. No. 5,652,645).

This projection aligner carries out the so-called scan-exposure in which the optical system and the supporting device for supporting the mask and the exposure object are relatively and two-dimensionally moved. To put it more concretely, in this aligner, the supporting device is moved in an X–Y plane by means of an X–Y driving device, and in the exposure process, the supporting device is moved back and forth repeating the go-and-stop motion with a lateral movement therebetween by a scanning pitch (distance).

In this projection aligner, however, the X–Y driving device has to be constituted to control each of such movements of the supporting device as described above, for example, to control the movement each time or every time the supporting device starts the above movement and/or stops the above movement. Especially, in order to move the supporting device at a high speed by the X–Y driving device, it would be required to additionally prepare another device for eliminating or reducing the physical load put on the X–Y driving device due to the weight and inertia of the supporting device, which disadvantageously causes the entire scale of the aligner to be large.

Furthermore, if the supporting device capable of supporting the large size mask and exposure object is used, the weight of the supporting device increases, according to which the inertia thereof becomes larger. Consequently, the physical load acting on the X–Y driving device comes to further increase. If the physical load becomes large, there come out such problems that it becomes impossible to ignore the influence of the backlash or the like on the movement accuracy of the supporting device, that the durability of the X–Y driving device is degraded, and so forth.

On one hand, there is disclosed an aligner of the type wherein no X–Y driving device is used but the mask and the exposure object are continuously rotated to carry out the scan-exposure (refer to, for example, the specification of JP Patent Public Disclosure No. 6-74945). In this aligner, however, as the mask and the exposure object are arranged so as to be located on two different planes, respectively, at least a part of the projection optical system being located between the mask and the exposure object and are respectively rotated by different driving devices, there come out such problems as precise positioning between the mask and the exposure object becomes difficult, two driving devices have to be in synchronization with each other with high precision, eccentricity in rotation of the mask and the expose object has to completely removed, and so forth. Therefore, in order to obviate these problems, the driving mechanism can not help being complicated and expensive.

Accordingly, it is an object of the invention to reduce a physical load put on a driving mechanism for moving a supporting device for supporting a mask and an exposure object having a photosensitive material, and also to simplify the structure of the driving mechanism.

SUMMARY OF THE INVENTION

According to the invention, there is provided an exposure method of exposing an exposure mask pattern of a mask for exposure on a photosensitive material, which comprises: an incidence step of letting at least a part of light from a light source for exposure be incident on the mask supported by a supporting device; an imaging step of letting transmission light from the mask be incident on the photosensitive material supported by the supporting device from a direction which is different from a direction of light incident on the mask, thereby causing the transmission light to form an image on the photosensitive material; a rotation step of rotating the supporting device such that a position of irradiation to the mask caused by light from the light source changes along a circumferential direction of the supporting device; and an irradiation position changing step of changing the irradiation of light to the mask as well as a position of irradiation of light to the photosensitive material along a direction which is different from the ciucumferential direction of the supporting device in a rotating plane of the supporting device while the supporting device is being rotated.

According to the invention, there is further provided an aligner for exposing an exposure pattern of a mask on a photosensitive material, comprising: a supporting device having a first supporting portion supporting the mask such that the mask receives at least a part of light from a light source for exposure and a second supporting portion supporting the photosensitive material such that the photosensitive material receives transmission light from the mask from a direction which is different from a direction of light incident on the mask; an imaging optical system which guides the transmission light from the mask, to the photosensitive material so as to form an image on the photosensitive material; a rotation unit for rotating the supporting device such that a position of irradiation to said mask caused by light from the light source changes along a circumferential direction of the supporting device; and an irradiation position changing device which changes the position of irradiation of light to the mask as well as a position of irradiation of light to the photosensitive material along a direction which is different from the circumferential direction of the supporting device in a rotating plane of the supporting device while the supporting device is being rotated.

The supporting device supporting the mask and the photosensitive material is rotated by the rotating device such that the position of irradiation to the mask caused by the light from the light source as well as the position of irradiation to the photosensitive material caused by the transmission light from the mask change along the circumferential direction of the supporting device. Furthermore, the irradiation position changing device changes the position of irradiation to the mask caused by the light from the light source and the position of irradiation to the photosensitive material by the transmission light from the mask change, in the rotating plane of the supporting device, along a direction which is different from the circumferential direction of the supporting device.

According to the invention, it is good enough for the supporting device to be continuously rotated by the rotating device, for example, always only in one direction. Therefore, a physical load as put on a driving device for moving the supporting device is reduced, which enables high speed scan-exposure comparing to the prior art scan-exposure making use of the X–Y driving device, thereby the throughput is improved.

It is possible to pass the transmission light from the mask via a plurality of reflecting mirrors and through at least one imaging lens, thereby changing an advancing direction of the transmission light and forming an image on the photosensitive material, and moving at least one of the plural reflecting mirrors.

It is possible to move the reflecting mirror toward the axis of rotation of the supporting device. It is also possible to move the imaging lens together with the reflecting mirror.

It is possible to pass the transmission light from the mask via a plurality of reflecting mirrors and through at least one concave mirror, thereby changing an advancing direction of the transmission light from the mask and forming an image on the photosensitive material, and moving the concave mirror. In this case, it is possible to move the concave mirror toward the axis of rotation of the supporting device.

The mask and the photosensitive material may be arranged on the supporting device such that they are rotationally symmetric with regard to the axis of rotation of the supporting device.

The irradiation position may be changed, while an optical path between the mask and the photosensitive material is kept constant.

DETAILED DESCRIPTION OF THE PREFERRED EMBODIMENTS

Figure 1:
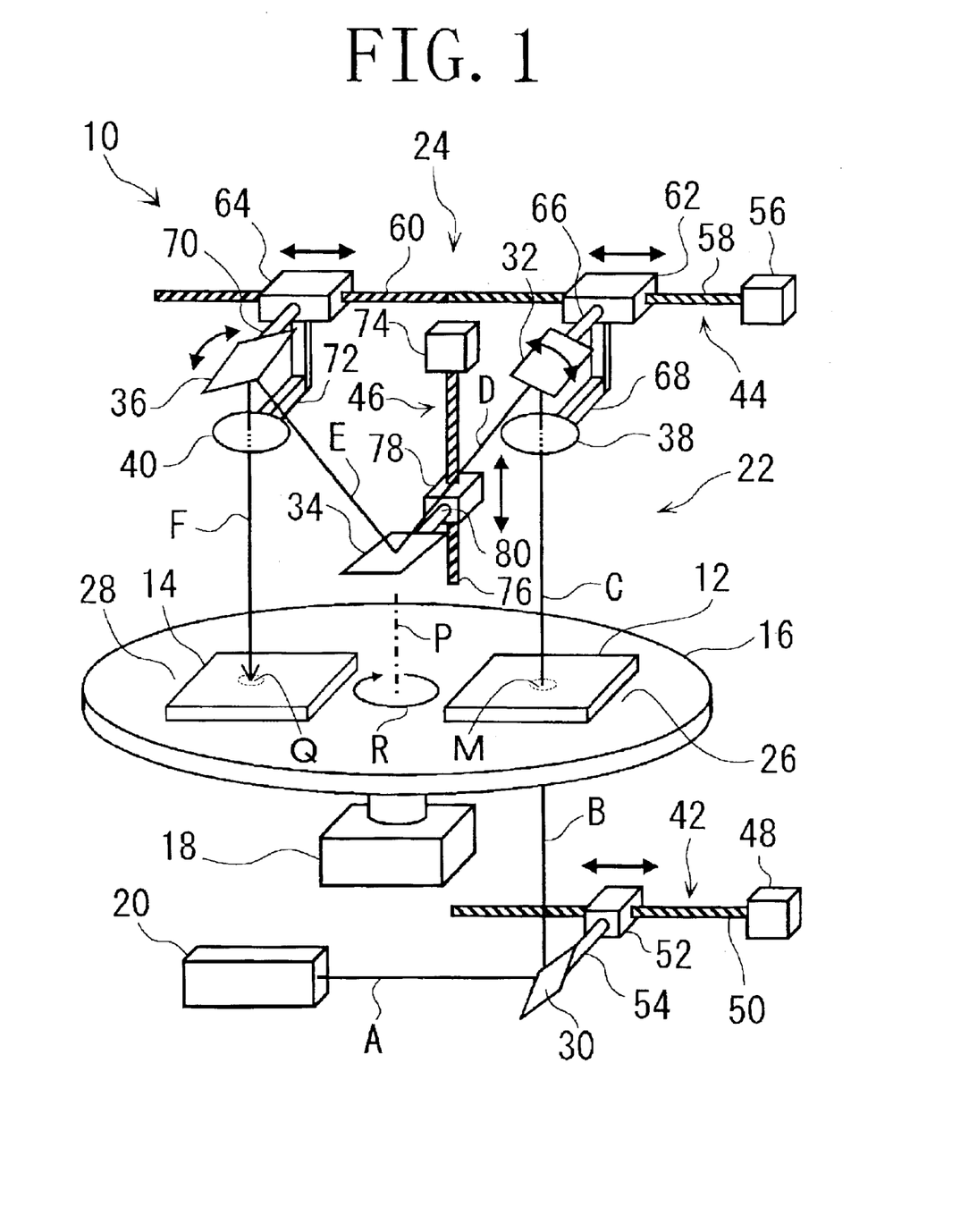
FIG. 1 is a perspective view schematically showing an aligner according to the first embodiment of the invention.
Figure 2:
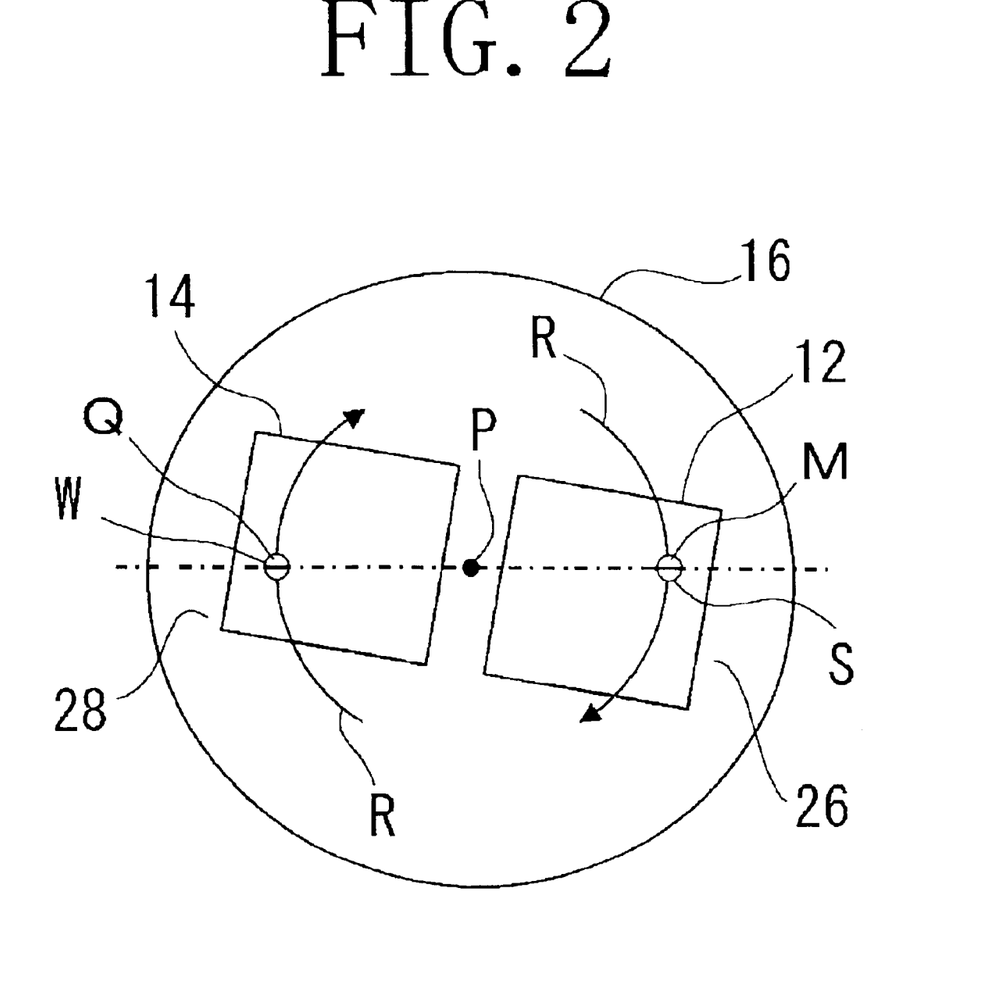
FIG. 2 is a plan view showing a supporting device of the aligner as shown in FIG. 1.

Referring to FIGS. 1 and 2, an aligner 10 includes a supporting device 16 for supporting a mask 12 as well as a object 14 to be exposed (referred to as "exposure object" hereinafter), a rotation unit 18 for turning the supporting device 16, an imaging optical device 22 for guiding a light or light beam originating in a light source unit 20 up to the exposure object 14 via the mask 12, and an irradiation position changing device 24 for changing an exposure position on the exposure object 14, which is coupled to the imaging optical device 22.

The light source unit 20 is arranged approximately to be below the supporting device 16 such that the light beam A from the light source unit 20 goes in the diametral direction of the supporting device 16. Various light source units are available. For example, an ultra-high pressure mercury lamp, KrF or ArF excimer laser system, and so forth may be used as a light source unit. The light source unit 20 is a unit from which the light beam is emitted with the section of the light beam formed to have a shape and a size which are convenient for irradiating a relatively small area, for example, a circular area having a diameter of about 20 mm. The irradiation area M to the mask 12 is not limited to the above circular area. It may be hexagonal or sectorial. In other words, instead of using the avobe light beam irradiating a circular area, such light beam as the irradiation area M to the mask 12 is hexagonal or sectorial may be used.

The mask 12 may be constituted, for example, by a light transmittable glass base material, on at least one surface of which a light reflecting metal film is formed in a certain pattern.

The exposure object 14 may be constituted, for example, by a plate-like base material, on one surface of which is formed a photosensitive layer made of a photosensitive material. The exposure object 14 and the mask 12 as shown FIG. 1 are an approximately equal in size and shape to each other.

In an example as shown, the supporting device 16 is a circular plate having the first supporting body 26 and the second supporting body 28, both of which are arranged on the circular plate-like supporting device 16 such that they mutually take a symmetric position, that is, a rotationally symmetric position, with regard to the rotation axis P of the supporting device 16. At least the first supporting body 26 is formed as a transparent portion allowing a light beam to transmit therethrough.

The mask 12 is detachably fitted to the first supporting body 26 by means of the first fitting device (not shown). On the other hand, the exposure object 14 is detachably fitted to the second supporting body 28 by means of the second fitting device (not shown) such that the photosensitive layer side of the exposure object 14 faces upward.

Accordingly, the mask 12 fitted to the first supporting body 26 and the exposure object 14 fitted to the second supporting body 28 come to mutually take a symmetric position, that is, a rotationally symmetric position, with regard to the rotation axis P of the supporting device 16. In other words, the mask 12 and the exposure object 14 are arranged to be separated from each other in the direction of the diameter orthogonal to the rotation axis P of the supporting device 16 (in the example as shown in FIG. 1, in the advancing direction of the light beam A incident on the reflecting mirror 30, that is, in the lateral direction in FIG. 1).

As described above, the supporting device 16 is the circular plate, on top of which the mask 12 and the exposure object 14 are fitted, so that the dimension of the supporting device in the up-and-down direction is small.

A rotation unit 18 rotates the supporting device 16 in one direction by means of a servo mechanism (not shown). In the example as shown, the rotation unit 18 rotates the supporting device 16 around the rotation axis P in the clockwise direction R.

The imaging optical device 22 is constituted by a reflecting mirror 30 arranged on the optical path between the light source unit 20 and the mask 12; three reflecting mirrors 32, 34, 36 which are arranged at three corner portions of a letter M, respectively, so as to form an M-shape as a whole; a lens 38 for imaging arranged on the optical path between the mask 12 and the reflecting mirror 32; and another lens 40 for imaging arranged on the optical path between the reflecting mirror 36 and the exposure object 14.

The reflecting mirror 30 guides the light beam originating in the light source unit 20 to the mask 12 (the irradiation area is shown by a letter M). The reflecting mirrors 32, 34, 36 sequentially change the advancing direction of the light beam from the reflecting mirror 30 and guides it to the exposure object 14 (exposure area is indicated by a letter Q). The lenses 38 and 40 focus the light beam from a light source unit 20 on the photosensitive layer of the exposure object 14 such that the pattern of the mask 12 is optically transferred to the photosensitive layer of the exposure object 14 at an equal magnification (in other words, an equal scale factor).

The shape and size of the reflecting mirror 34 are determined so as to have the function as an optical "stop". Instead of using the reflecting mirror 34 that is given a certain restriction on its size and shape, a stop device or a member having a pinhole may be arranged immediately before the reflecting mirror 34.

The light beam guided to the photosensitive layer of the exposure object 14 is focused on the above photosensitive layer, thereby transferring the image of the irradiated area on the mask 12 to the exposure object 14.

The irradiation position changing device 24 linearly moves the reflecting mirror 30 by means of a driving device 42 in the advancing direction of the light beam A which is incident on the reflecting mirror 30. Furthermore, the irradiation position changing device 24 linearly moves the reflecting mirrors 32, 36 as well as the lenses 38, 40 by means of a driving device 44 in the advancing direction of the light beam A. Still further, the irradiation position changing device 24 turns the reflecting mirrors 32, 36. Also, the irradiation position changing device 24 linearly moves the reflecting mirror 34 by means of a driving device 46 in the direction vertical to the advancing direction of the light beam A.

The driving device 42 includes a motor 48, a threaded rod 50 connected with the rotary shaft of the motor 48, and a moving body 52 thread-coupled with the threaded rod 50. The threaded rod 50 extends in the advancing direction of the light beam A incident on the reflecting mirror 30. A moving body 52 is irrotationally supported by a guide rail (not shown) and is moved with the rotation of the threaded rod 50, in the advancing direction of the light beam A.

The moving body 52 is provided with a connection rod 54 extending in the direction approximately vertical to the threaded rod 50 as well as approximately in parallel with the supporting device 16 and the reflecting mirror 30 is fitted to the connection rod 54. Accordingly, the reflecting mirror 30 moves the irradiation position caused by the light beams B incident on the mask 12 from the peripheral side of the supporting device 16 inward in the radial direction of the supporting device 16 or vice versa, that is, in the advancing direction of the light beam A.

The driving device 44 includes a motor 56, a threaded rod 58 connected with the rotary shaft of the motor 56, a moving body 62 thread-coupled with the threaded rod 58, and another moving body 64 thread-coupled with another threaded rod 60 which is connected with the threaded rod 58. The direction of thread cutting on the surface of the threaded rod 58 is made opposite to that of the threaded rod 60.

A moving body 62 is irrotationally supported by a guide rail (not shown) and is moved with the rotation of the threaded rod 58, in the advancing direction of the light beam A. The moving body 62 is provided with connection rods 66 and 68 extending in the direction approximately vertical to the threaded rod 58 as well as approximately in parallel with the supporting device 16, and a reflecting mirror 32 and a lens 38 are fitted to the respective connection rods 66 and 68.

Accordingly, with the constitution of the driving device 44 as described above, it becomes possible for the reflecting mirror 32 and the lens 38 to move in the advancing direction of the light beam A so that they can receive the light beam reflected by the reflecting mirror 30.

The moving body 62 accommodates a motor (not shown). This motor rotates the connection rod 66 around the rotation axis extending in the longitudinal direction of the connection rod 66, thereby turning the reflecting mirror 32 and changing the direction of the reflecting face of the reflecting mirror 32 such that the light beam reflected by the reflecting mirror 30 is incident on the reflecting mirror 34.

A moving body 64 is irrotationally supported by a guide rail (not shown) and is moved with the rotation of the threaded rod 60, in the advancing direction of the light beam A. The moving body 64 is provided with connection rods 70 and 72, to respective tip portions of which the reflecting mirror 36 and the lens 40 are fitted. Accordingly, the reflecting mirror 36 and the lens 40 are moved in the advancing direction of the light beam A so as to receive the light beam reflected by the reflecting mirror 34.

The moving body 64 accommodates a motor (not shown). This motor rotates the connection rod 70, thereby turning the reflecting mirror 36 and changing the direction of the reflecting face of the reflecting mirror 36 such that the light beam reflected by the reflecting mirror 34 is incident on the reflecting mirror 36.

A driving device 46 includes a motor 74, a threaded rod 76 connected with the rotary shaft of the motor 74, and a moving body 78 thread-coupled with the threaded rod 76.

A moving body 78 is irrotationally supported by a guide rail (not shown) and is moved up and down with the rotation of the threaded rod 76 in the direction approximately in parallel with the rotation axis P of the supporting device 16. The moving body 78 is provided with a connection rod 80 extending in the direction approximately vertical to the threaded rod 76 as well as approximately in parallel with the supporting device 16. The reflecting mirror 34 is fitted to the tip portion of the connection rod 80.

Accordingly, the reflecting mirror 34 is moved up and down approximately in parallel with the rotation axis P of the supporting device 16 so as to receive the light beam reflected by the reflecting mirror 32 and guide the received light beam to the reflecting mirror 36.

In the next, there will be explained an exposure method using scan-exposure with reference to FIGS. 2 through 4. According to this method, the light beam and a set of the mask 12 and the exposure object 14 are relatively and 2-dimensionally moved by means of the aligner 10, thereby totally transferring the pattern of the mask 12 to the exposure object 14.

The following explanation will be made about a case where the scan is performed by advancing the irradiating position by the light beam B incident on the mask 12 from the peripheral side of the supporting device 16 inward (in other words, toward the rotation axis P) in the radial direction of the supporting device 16.

Figure 3A:
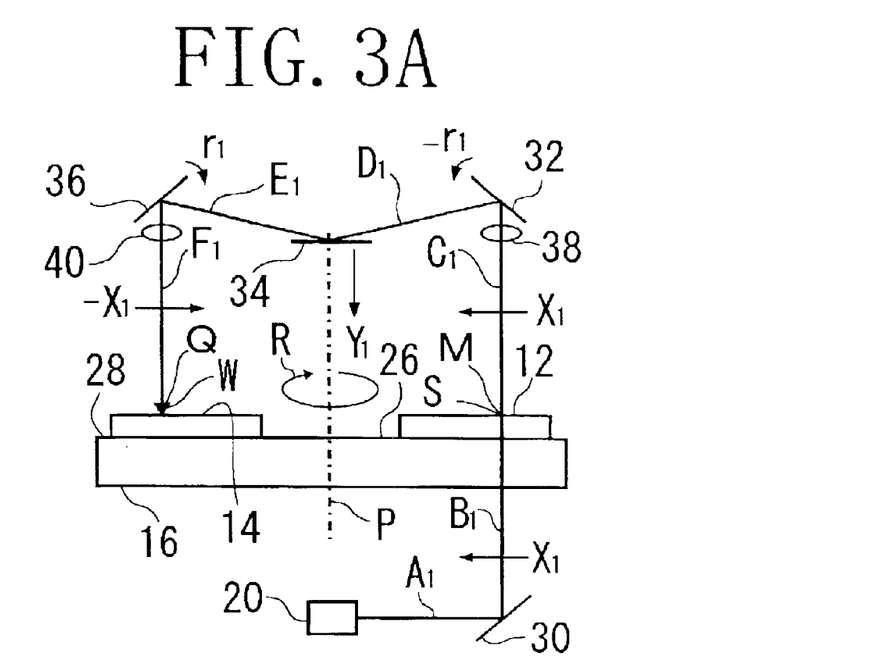
FIGS. 3A and 3B are side views for describing the operation of the aligner as shown in FIG. 1.

Referring to FIGS. 2 and 3A, the mask 12 and the exposure object 14 are fitted to the supporting device 16, in advance of exposure, such that they mutually take a symmetric position, that is, a rotationally symmetric position, with regard to the rotation axis P of the supporting device 16.

Furthermore, the reflecting mirror 30 is moved by the driving device 42, so that the irradiation area M to the mask 12 can be positioned furthest away from the rotation axis P of the supporting device 16, in other words, positioned nearest the periphery of the supporting device 16.

Still further, the reflecting mirrors 32, 34 and 36 are respectively moved by the driving devices 44 and 46 to take respective positions such that the transmission light beams from the mask 12 forms an exposure area Q at a position W on the exposure object 14 which takes a symmetric position with the position S of the irradiation area M to the mask 12 with regard to the rotation axis P of the supporting device 16.

The scan-exposure by means of the aligner 10 is executed by simultaneously carrying out the following steps which are: the step of guiding the light beam from the light source unit 20 to the exposure object 14 via the mask 12; the step of rotating the supporting device 16 by means of the rotation unit 18; and the step of moving the reflecting mirrors 30, 32, 34, 36 as well as the lenses 38, 40 and turning the reflecting mirrors 32, 36, thereby advancing the exposure position on the exposure object 14 from the peripheral side of the supporting device 16 inward in the radial direction of the supporting device 16. These steps will be further explained in detail in the following.

A control panel (not shown) provided in the aligner 10 being operated, a start signal is inputted to a control device (not shown), which in turn transmits a signal for starting light beam emission to the light source unit 20, which then continues to emit flux of light for a predetermined period of time. If the excimer laser system is used as a light source unit, the light source unit 20 generates laser beam in a series of pluses for a predetermined period of time.

Referring to FIG. 3A, in the initial stage of the scan-exposure process, an area of the mask 12 which is farthest from the rotation axis P of the supporting device 16 is irradiated with the light beam from the light source unit 20. The reflecting mirror 30 reflects at least a part of the light beam $A_1$ from the light source unit 20. This reflected light beam proceeds as the light beam $B_1$ to be incident on the mask 12. At least a part of the light beam incident on the mask 12 proceeds as the light beam $C_1$ depending on whether or not the portion of the mask 12 on which the light beam is incident allows the light beam to pass through it. The reflecting mirror 32 changes the advancing direction of the light beam coming through the lens 38 and guides it as the light beam $D_1$ to the reflecting mirror 34.

The reflecting mirror 34 changes the advancing direction of the reflected light beam $D_1$ coming from the reflecting mirror 32 and guides it as the light beam $E_1$ to the reflecting mirror 36, which in turn changes the advancing direction of the light beam $E_1$ and guides it as the light beam $F_1$ to the exposure object 14 through the lens 40. The lenses 38 and 40 focus the light beam passing through the mask 12 on the photosensitive layer of the exposure subject 14 such that the pattern of the mask 12 is optically transferred to the photosensitive layer of the exposure object 14, thereby forming the exposure area Q in the position W of the exposure object 14.

While the light beam from the light source unit 20 is guided to the exposure object 14 as described above, the supporting device 16 is rotated around its rotation axis P by means of the rotation unit 18. Accordingly, with this rotation of the supporting device 16 (including the mask 12), the irradiation area M substantially displaces with regard to the supporting device 16 as if it displaced by itself along a certain course in parallel with the periphery of the supporting device 16 despite that the light beam ($B_1$ to $C_1$) is actually made immovable in the circumferential direction of the supporting device 16. Thus, whenever the supporting device 16 finishes its one rotation, the irradiation area M comes back approximately to the same position as its original start position S.

While the irradiation area M moves from the position at which the light beam from the light source unit 20 is not able to be incident on he mask 12 to the position at which the above light beam is able to be incident on the mask 12, the control device (not shown) of the aligner 10 sends a driving signal to the motor 48 of the driving device 42. Then, the motor 48 having received the driving signal rotates the threaded rod 50 by a predetermined angle of rotation to move the reflecting mirror 30 with the help of the moving body 52 toward the rotation axis P by a predetermined amount (distance) $X_1$ (see FIG. 3A) in the direction approximately in parallel with the supporting device 16. With this, the irradiation area M moves in the direction to approach the rotation axis P of the supporting device 16, in other words, the irradiation area M moves toward the rotation axis P along the radial direction of the supporting device 16, in other words, from the peripheral side of the supporting device 16 inward in the radial direction of the supporting device 16.

Figure 4:
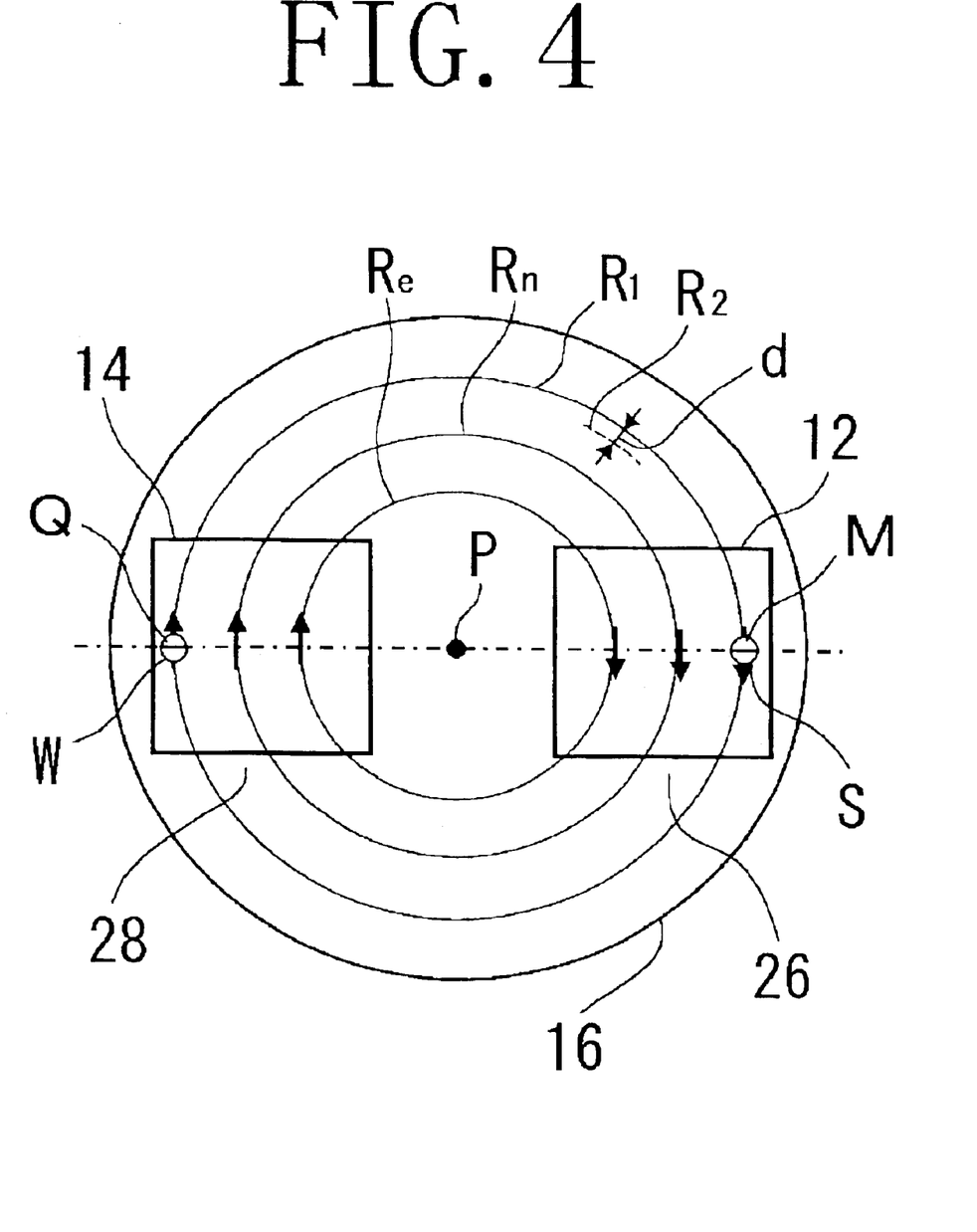
FIG. 4 is a side view for describing the operation of the aligner as shown in FIG. 1.

Referring to FIG. 4, the irradiation area M is moved by a distance of d from the peripheral side of the supporting device 16 inward in the radial direction of the supporting device 16 in response to one rotation of the supporting device 16. Accordingly, the irradiation area M is moved in the circumferential direction as well as toward the rotation axis P in the radial direction so as to draw a plurality of coaxial circles $R_1, R_2, \ldots, Rn, \ldots, Re$ having a common center at the rotation axis P and formed at an interval pitch of d at every rotation of the supporting device 16. The pitch d is a radial interval between Rn and Rn+1, and depends on its size and shape of the irradiation area M.

As described above, in order to move the scanning path of the irradiation area M by the interval pitch of d from the peripheral side of the supporting device 16 inward in the radial direction of the supporting device 16 at every rotation of the supporting device 16, the reflecting mirror 30 is moved by a distance of d while the reflecting mirrors 32, 34, 36 as well as the lenses 38, 40 are moved, and the reflecting mirrors 32, 36 are turned in synchronization with the movement of the reflecting mirror 30 as will be described in detail in following.

The motor 56 of the driving device 44 rotates the threaded rod 58 by a predetermined angle of rotation to move the reflecting mirror 32 and the lens 38 with the help of the moving body 62 toward the rotation axis P by a predetermined amount (distance) $X_1$ (see FIG. 3A) in the direction approximately in parallel with the surface of rotation of the supporting device 16. Furthermore, the motor 56 also rotates the threaded rod 60 through the threaded rod 58 by a predetermined angle of rotation to move the reflecting mirror 36 and the lens 40 with the help of the moving body 64 toward the rotation axis P by a predetermined amount (distance) $X_1$ (see FIG. 3A) in the direction approximately in parallel with the surface of rotation of the supporting device 16.

Figure 3B:
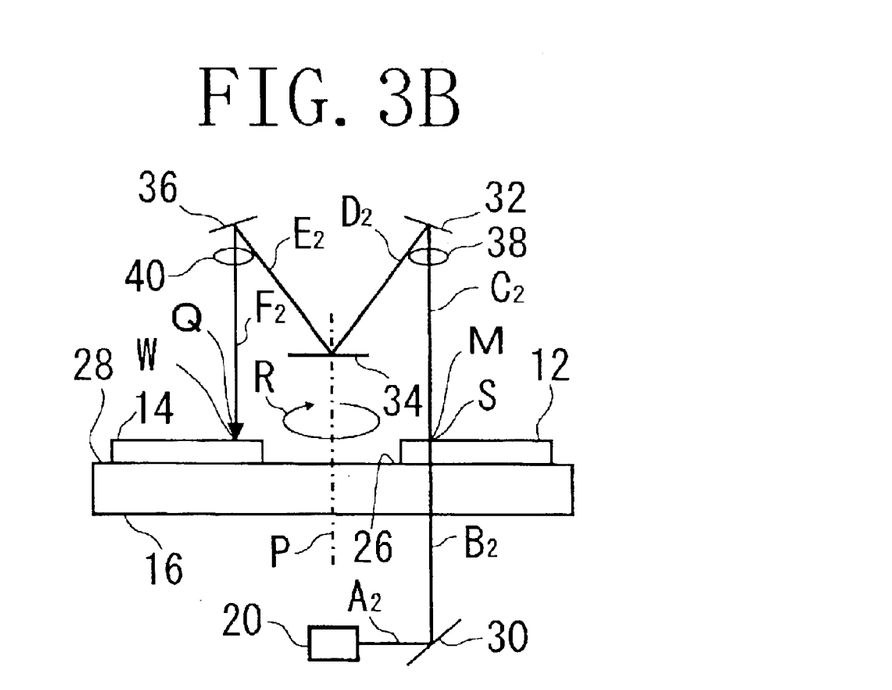

The motor (not shown) accommodated in the moving body 62 rotates the connection rod 66 around the axis extending in the longitudinal direction of it to turn the reflecting mirror 32 in the counterclockwise direction by $r_1$ as shown in FIGS. 3A and 3B, thereby changing the direction of the reflecting surface of the reflecting mirror 32. On the other hand, the motor (not shown) accommodated in the moving body 64 rotates the connection rod 70 around the axis extending in the longitudinal direction of it to turn the reflecting mirror 36 in the clockwise direction by $r_1$ as shown in FIGS. 3A and 3B, thereby changing the direction of the reflecting surface of the reflecting mirror 36.

The motor 74 of the driving device 46 rotates the threaded rod 76 by a predetermined angle of rotation to move the reflecting mirror 34 downward with the help of the moving body 78 in the direction approximately vertical to the supporting device 16 by a predetermined amount (distance) of $Y_1$ (see FIG. 3A).

As described above, the reflecting mirrors 32, 34, 36 and the lenses 38, 40 are moved in synchronization with the movement of the reflecting mirror 30, thereby turning the reflecting mirrors 32, 36 by a predetermined angle of rotation. Consequently, the amount (distance) of the movement of the exposure area Q to the exposure object 14 becomes equal to that of the irradiation area M directed toward the rotation axis P of the supporting device 16, in other words, moving from the peripheral side of the supporting device 16 inward in the radial direction of the supporting device 16.

Accordingly, the irradiation area M to the mask 12 and the exposure area Q to the exposure object 14 always take a symmetric position, that is, a rotationally symmetric position with regard to the rotation axis P of the supporting device 16. Furthermore, the length of the optical path between the mask 12 and the exposure object 14 can be always kept constant.

To put it more concretely, the optical path length $L_1$ between the mask 12 and the lens 38, the optical path length $L_2$ between the lens 38 and the reflecting mirror 34, the optical path length $L_3$ between the reflecting mirror 34 and the lens 40, and the optical path length $L_4$ between the lens 40 and the exposure object 14 become always equal to one another.

Furthermore, if the exposure magnification of 1:1 is set by using a telecentric optical system, the relation among the optical path lengths $L_1$, $L_2$, $L_3$ and $L_4$ is expressed as $L_1=L_2=L_3=L_4=f$, where f indicates focal distances of the lens 38, 40. Accordingly, when magnification is 1:1, the lenses 38 and 40 having the same focal length are used.

As described above, the scan-exposure is carried out such that the irradiation area M to the mask 12 and the exposure area Q to the exposure object 14 always take respective positions which are rotationally symmetric with regard to the rotation axis P of the supporting device 16.

Referring to FIG. 3B, in the final stage of the scan-exposure, the mask 12 is irradiated at a position of it nearest the rotation axis P with the light beam from the light source unit 20. With this, the pattern of the mask 12 is totally transferred to the exposure object 14, thereby to finish the exposure.

As described above, according to the invention, while the scan-exposure is carried out, it is sufficient for the supporting device 16 to only rotate in one direction. Accordingly, with the simple driving system like the above, the invention is able to obviate the problem as seen in a prior art exposure technique of the type wherein, for example, an X-Y driving device is used for driving the supporting device in the X-Y directions, the problems caused in connection with frequent repetition of the go-and-stop motion of the supporting device. Accordingly, it becomes possible to minimize the physical load acting on the driving system. Less physical load enables high speed scan-exposure, and the throughput is further improved.

In the exposure process, if the amount or quantity of the light beam irradiating the mask 12 is constant, the rotational speed of the supporting device 16 is made slower when the irradiation area M is positioned near the periphery of the supporting device 16. Contrary to this, the rotational speed of the supporting device 16 is made gradually faster as the irradiation area M gradually approach the inner portion near the rotation axis P of the supporting device 16. In short, the supporting device 16 is controlled to rotate such that the linear velocity becomes constant. Furthermore, it is possible to control the supporting device 16 such that it is rotated at a constant angular velocity, that is, at uniform velocity. In this case, however, the amount of the light beam for exposure may be changed depending on the place to be exposed.

Figure 5:
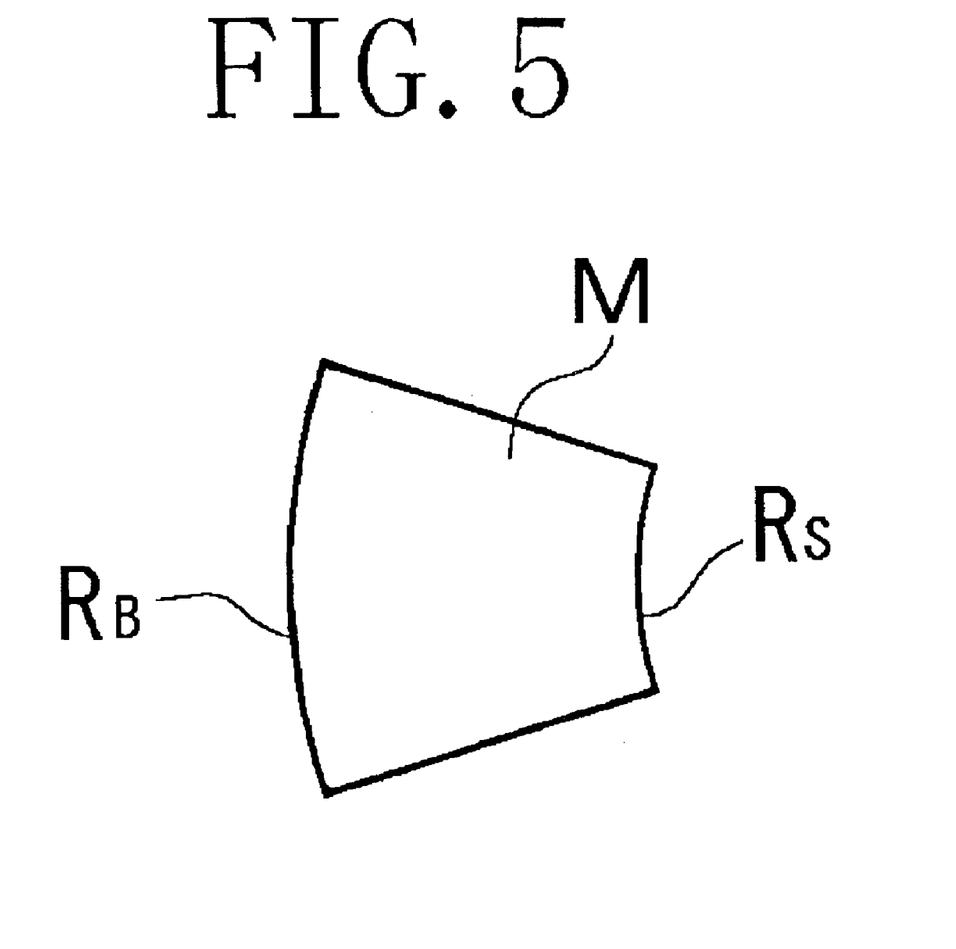
FIG. 5 is a plan view showing an example of an irradiation area as used in the aligner according to the invention.

Referring to FIG. 5, the irradiation area M may have a sectorial shape which is defined by two circular arcs $R_B$, $R_S$ having different radii of curvature from each other. If the irradiation area M has the shape like this, there can be eliminated or reduced the issue on the difference between the amount of the light beam incident on the area in the vicinity of the outer peripheral side (circular arc $R_B$ side) of the irradiation area M and that of the inner peripheral side (circular arc $R_S$ side) of the irradiation area M at the time of scan-exposure caused when the shape of the irradiation area M is circular, hexagonal or the like.

In the example as shown in FIG. 4, the scanning path of the irradiation area M is drawn as coaxial circles. However, the scanning path of the irradiation area M may be drawn as spiral shape so that the irradiation area M gradually approach the center of rotation. In either case, when using a scanning path of the coaxial circular type or the spiral type, the irradiation area M and the exposure area Q may be moved radially inward to the peripheral side of the supporting device 16.

The above explanation has been made about the case where the lenses 38, 40 for imaging are considered as a single lens, respectively. However, it possible to use a plurality of lenses for the lenses 38 or 40 in response to a desired degree of resolution. For example, the telecentric optical system with an image multiplication of 1:1 may be used-as a plurality of lenses.

Figure 6:
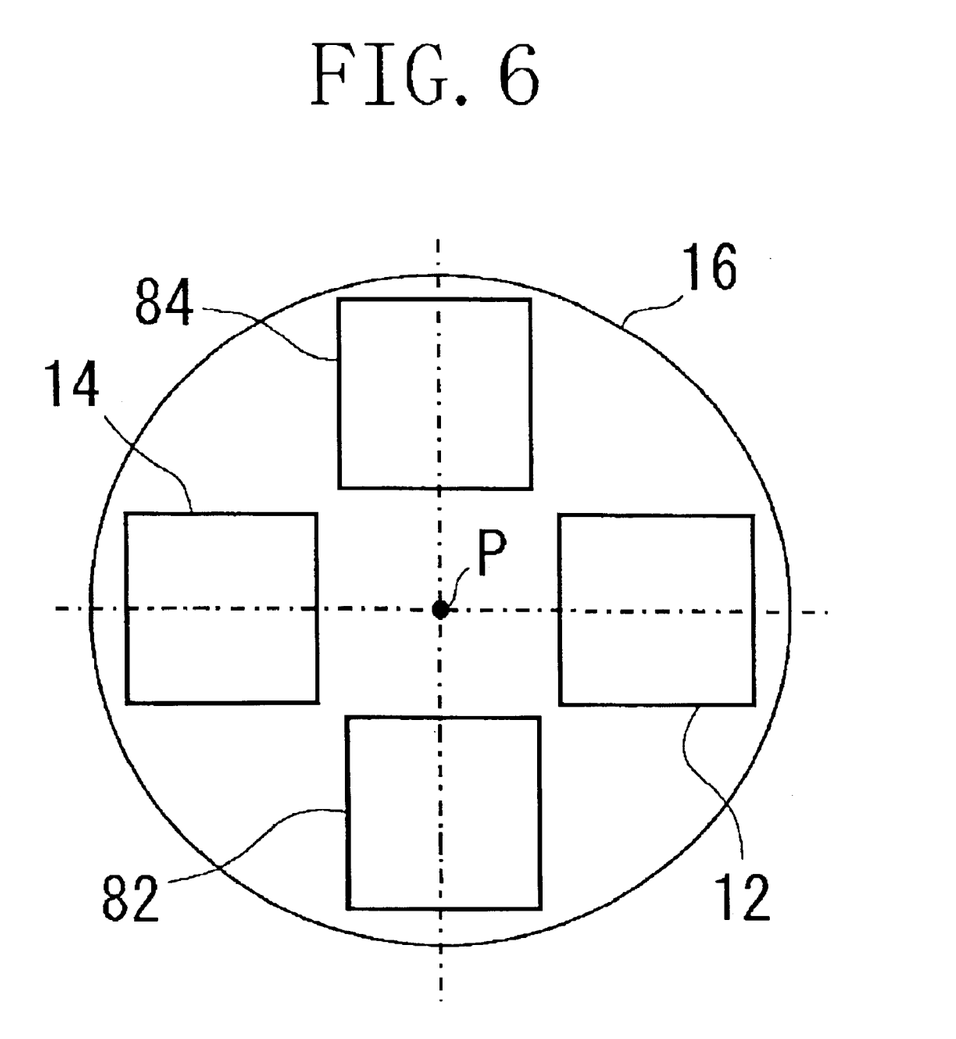
FIG. 6 is a plan view showing an example of a supporting device as used in the aligner according to the invention.

If a plurality of sets of masks and exposure objects are arranged on the supporting device 16 as shown in FIG. 6, the throughput is further improved. In the example as shown, a set of the mask 12 and the exposure object 14 is arranged so as to make an angle of 90° to another set of a mask 82 and an exposure object 84.

Figure 7:
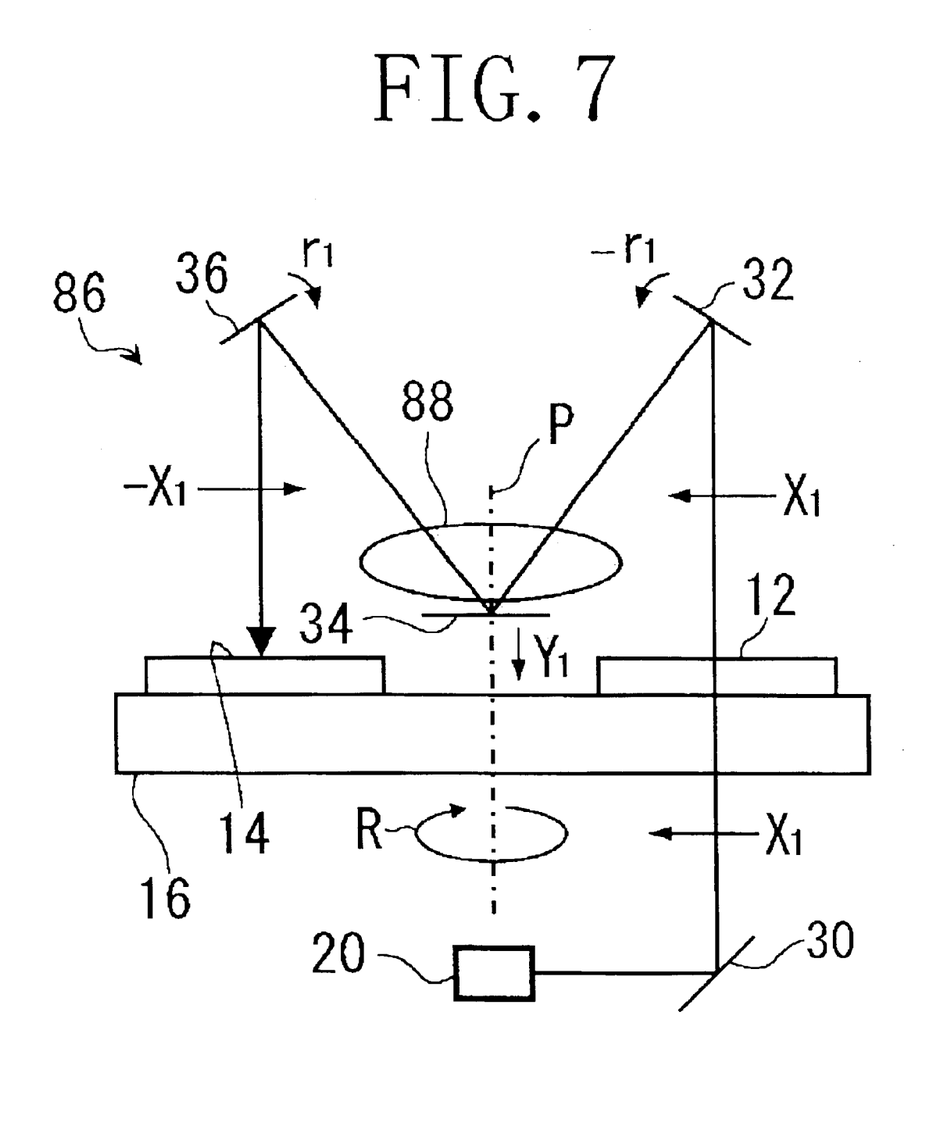
FIG. 7 is a side view schematically showing an aligner according to the second embodiment of the invention.

In FIG. 7, constituents in common with those of the aligner 10 as shown in FIGS. 1 through 4 are indicated with the same reference numerals or marks and at the same time, some of common constituents are omitted from this figure just for the purpose of simplification.

Referring to FIG. 7, an aligner 86 is provided with only one lens 88 for imaging instead of the lenses 38, 40 used in the aligner 10 as shown in FIG. 1. The lens 88 is fitted to the moving body 78 of the driving device 46 by using a connection rod (not shown). Therefore, the lens 88 is linearly moved together with the reflecting mirror 34 with the help of the moving body 78 coupled with the threaded rod 76 rotationally driven by the motor 74.

In the aligner 86, similarly to the case of the aligner 10, the optical path length between the mask 12 and the exposure object 14 is always kept constant. To put it in more detail, the optical path length $LL_1$ between the mask 12 and the lens 88 is always kept equal to the optical path length $LL_2$ between the lens 88 and the exposure object 14.

As the aligner according to the second embodiment as shown in FIG. 7 requires only one lens for imaging, the structure of it is far simplified in comparison with that of the prior art aligner to facilitate, the design and manufacture of it is made far easy.

Figure 8:
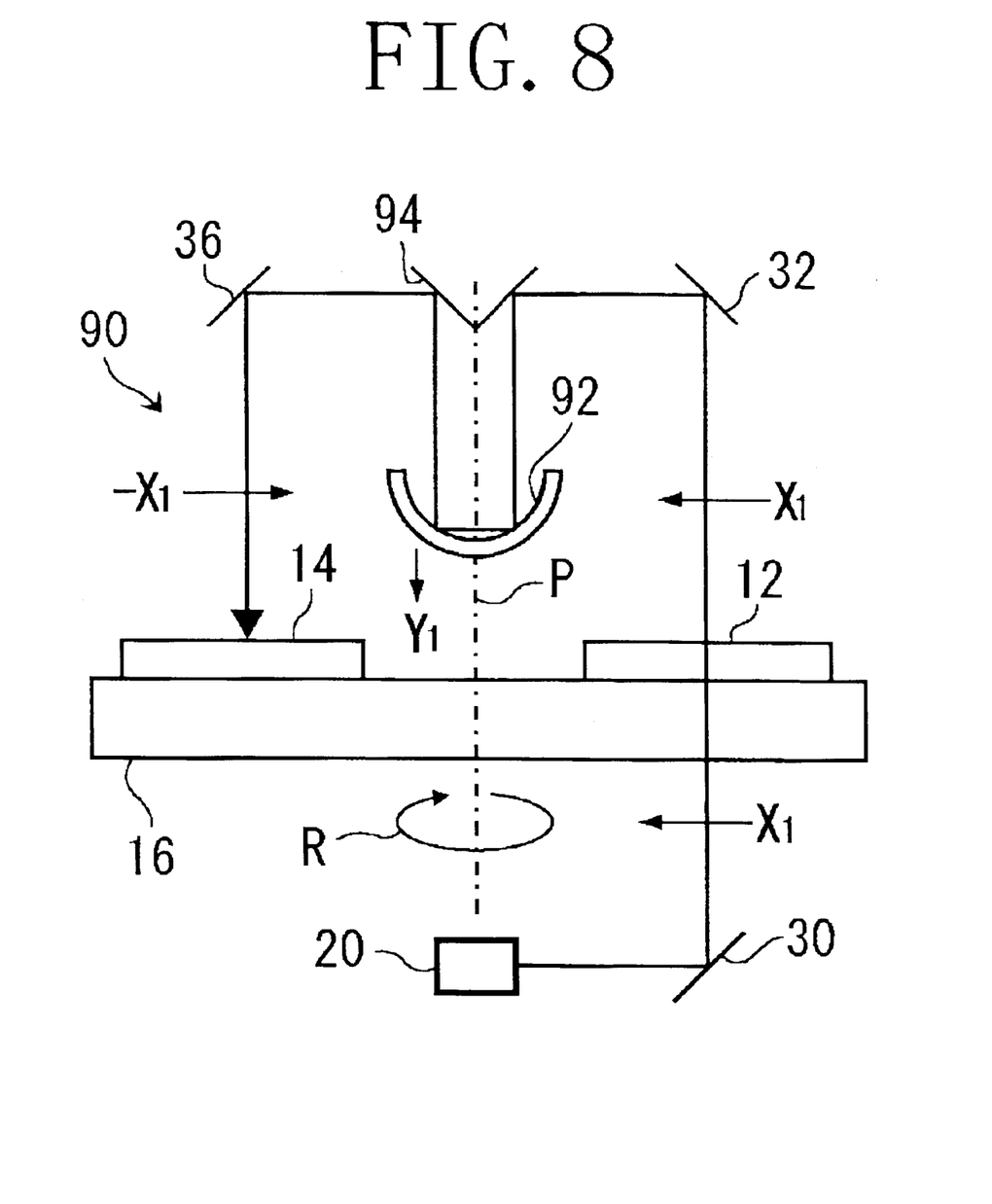
FIG. 8 is a side view schematically showing an aligner according to the third embodiment of the invention.

In FIG. 8, constituents in common with those of the aligner 10 as shown in FIGS. 1 through 4 are indicated with the same reference numerals or marks and at the same time, some of common constituents are omitted from this figure just for the purpose of simplification.

Referring to FIG. 8, an aligner 90 uses a concave mirror 92 and a reflecting mirror 94 instead of the lenses 38, 40 and the reflecting mirror 34 used in the aligner 10 as shown in FIG. 1. The concave mirror 92 is fitted to the moving body 78 of the driving device 46 by using a connection rod (not shown). Therefore, the concave mirror 92 is linearly moved together with the moving body 78 coupled with the threaded rod 76 rotationally driven by the motor 74. As the reflecting mirror 94 is immovably fitted to a predetermined position on the fixing side (not shown), it does not move.

The concave mirror 92 has a reflecting surface on the concave surface. The concave mirror 92 has the function of a reflecting mirror as well as a lens for imaging. The reflecting mirror 94 guides the light beam reflected by the reflecting mirror 32 to the concave mirror 92 and further guides the reflected light beam from the concave mirror 92 to the reflecting mirror 36.

In the aligner 90, similarly to the cases of the aligners 10 and 86, the optical path length between the mask 12 and the exposure object 14 is always kept constant. To put it in more detail, the optical path length $LL_3$ between the mask 12 and the concave mirror 92 is always kept equal to the optical path length $LL_4$ between the concave mirror 92 and the exposure object 14.

In the third embodiment as shown in FIG. 8, there is no need for any lens for imaging to be used. Therefore, there can be obviated problems related to the design, manufacture or the like of the lens which include so many restrictions, and the structure of the aligner is far simplified in comparison with the prior art aligner, so that a design and manufacture of it is made much easier.

While some embodiments of the invention have been shown and described in the above with reference to the accompanying drawings, the invention is not limited to such embodiments. Various changes and modifications will be possible without departing from the gist of the invention.

What is claimed is:

1. An exposure method of exposing an exposure pattern of a mask on a photosensitive material, comprising:

an incidence step of letting at least a part of light from a light source for exposure be incident on said mask supported by a supporting device;

an imaging step of letting transmission light from said mask be incident on said photosensitive material supported by said supporting device from a direction which is different from a direction of light incident on said mask, thereby causing said transmission light to form an image on said photosensitive material;

a rotation step of rotating said supporting device such that a position of irradiation to said mask caused by light from said light source changes along a circumferential direction of said supporting device; and an irradiation position changing step of changing said position of irradiation of light to said mask as well as a position of irradiation of light to said photosensitive material along a direction which is different from said circumferential direction of said supporting device in a rotating plane of said supporting device while said supporting device is being rotated.

2. An exposure method as claimed in claim 1, wherein said imaging step includes passing the transmission light from said mask via a plurality of reflecting mirrors and through at least one imaging lens, thereby changing an advancing direction of the transmission light from said mask and forming an image on said photosensitive material, and wherein said irradiation position changing step includes moving at least one of said plural reflecting mirrors.

3. An exposure as claimed in claim 2, wherein moving said reflecting mirror includes moving said reflecting mirror toward the axis of rotation of said supporting device.

4. An exposure method as claimed in claim 2, wherein said irradiation position changing step further includes moving said imaging lens together with said reflecting mirror.

5. An exposure method as claimed in claim 3, wherein said irradiation position changing step further includes moving said imaging lens together with said reflecting mirror.

6. An exposure method as claimed in claim 1, wherein said imaging step includes passing the transmission light from said mask via a plurality of reflecting mirrors and through at least one concave mirror, thereby changing an advancing direction of the transmission light from said mask and making said transmission light form an image on said photosensitive material, and wherein said irradiation position changing step includes moving said concave mirror.

7. An exposure method as claimed in claim 6, wherein moving said concave mirror includes moving said concave mirror toward the axis of rotation of said supporting device.

8. An exposure method as claimed in any one of claims 1 to 7, wherein said mask and said photosensitive material are arranged on said supporting device such that they are rotationally symmetric with regard to the axis of rotation of said supporting device.

9. An exposure method as claimed in claim 8, wherein said irradiation position changing step includes changing the position of irradiation of light to said mask as well as the position of irradiation of light to said photosensitive material, while a length of an optical path between said mask and said photosensitive material is kept constant.

10. An exposure method as claimed in any one of claims 1 to 7, wherein said irradiation position changing step includes changing the position of irradiation of light to said mask as well as the position of irradiation of light to said photosensitive material, while a length of an optical path between said mask and said photosensitive material is kept constant.

11. An aligner for exposing an exposure pattern of a mask on a photosensitive material, comprising:
- a supporting device having a first supporting portion supporting said mask such that said mask receives at least a part of light from a light source for exposure and a second supporting portion supporting said photosensitive material such that said photosensitive material receives transmission light from said mask from a direction which is different from a direction of light incident on said mask;
- an imaging optical system which guides the transmission light from said mask, to said photosensitive material so as to form an image on said photosensitive material;
- a rotation unit for rotating said supporting device such that a position of irradiation to said mask caused by light from said light source changes along a circumferential direction of said supporting device; and
- an irradiation position changing device which changes said position of irradiation of light to said mask as well as a position of irradiation of light to said photosensitive material along a direction which is different from said circumferential direction of said supporting device in a rotating plane of said supporting device while said supporting device is being rotated.

12. An aligner as claimed in claim 11, wherein said imaging optical system includes a plurality of reflecting mirrors and at least one imaging lens which are arranged along an optical path between said mask and said photosensitive material, and said irradiation position changing device includes a reflecting mirror moving device for moving at least one of said plural reflecting mirrors.

13. An aligner as claimed in claim 12, wherein said reflecting mirror moving device moves said reflecting mirror toward the axis of rotation of said supporting device.

14. An aligner as claimed in claim 12, wherein said reflecting mirror moving device further moves said imaging lens together with said reflecting mirror.

15. An aligner as claimed in claim 13, wherein said reflecting mirror moving device further moves said imaging lens together with said reflecting mirror.

16. An aligner as claimed in claim 11, wherein said imaging optical system includes a plurality of reflecting mirrors and at least one concave mirror which are arranged along an optical path between said mask and said photosensitive material, and said irradiation position changing device includes a concave mirror moving device for moving said concave mirror.

17. An aligner as claimed in claim 16, wherein said concave mirror moving device moves said concave mirror toward the axis of rotation of said supporting device.

18. An aligner as claimed in any one of claims 11 to 17, wherein said mask and said photosensitive material are arranged on said supporting device such that they are rotationally symmetric with regard to the axis of rotation of said supporting device.

19. An aligner as claimed in claim 18, wherein said irradiation position changing device changes the position of irradiation of light to said mask as well as the position of irradiation of light to said photosensitive material such that a length of an optical path between said mask and said photosensitive material is kept constant.

20. An aligner as claimed in any one of claims 11 to 17, wherein said irradiation position changing device changes the position of irradiation of light to said mask as well as the position of irradiation of light to said photosensitive material such that a length of an optical path between said mask and said photosensitive material is kept constant.

* * * * *